(12) United States Patent
Roy et al.

(10) Patent No.: US 10,257,921 B1
(45) Date of Patent: Apr. 9, 2019

(54) EMBEDDED AIR GAP TRANSMISSION LINES

(71) Applicant: Google LLC, Mountain View, CA (US)

(72) Inventors: Richard Roy, Santa Clara, CA (US); Pierre-luc Cantin, Palo Alto, CA (US); Teckgyu Kang, Saratoga, CA (US); Woon Seong Kwon, Cupertino, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/951,717

(22) Filed: Apr. 12, 2018

(51) Int. Cl.
*H05K 1/02* (2006.01)
*H01P 3/08* (2006.01)

(52) U.S. Cl.
CPC ............... *H05K 1/024* (2013.01); *H01P 3/08* (2013.01); *H05K 2201/0715* (2013.01)

(58) Field of Classification Search
CPC ... H05K 1/024; H05K 2201/0715; H01P 3/08
USPC .......................................................... 174/261
See application file for complete search history.

(56) References Cited

U.S. PATENT DOCUMENTS

| 5,712,607 A | 1/1998 | Dittmer et al. |
| 6,535,088 B1 | 3/2003 | Sherman et al. |
| 7,663,064 B2 | 2/2010 | Dutta et al. |
| 2004/0048420 A1 | 3/2004 | Miller |

*Primary Examiner* — Tremesha S Willis
(74) *Attorney, Agent, or Firm* — McDermott Will & Emery LLP

(57) ABSTRACT

Embedded air gap transmission lines and methods of fabrication are provided. An apparatus having an air gap transmission line can include a first conductive plane, a core dielectric layer having a bottom surface in contact with the first conductive plane, a conductor having a bottom surface in contact with a top surface of the core dielectric layer, and a second conductive plane positioned over, and spaced apart from, a top surface of the conductor such that a gap separates the conductor from the second conductive plane. The top surface of the conductor is separated from the bottom surface of the second conductive plane by a first distance measured along an axis normal to the first conductive plane, and the bottom surface of the conductor is separated from the first conductive plane by a second distance greater than the first distance measured along the axis.

18 Claims, 8 Drawing Sheets

EMBEDDED AIR GAP TRANSMISSION LINES

BACKGROUND

Signal lines in printed circuit boards, cables, and other conveyance structures exhibit transmission-line behavior for signals having a sufficiently high frequency components; that is, signals with transition times smaller than the electrical length of the wire or trace. A transmission line includes one or more signal line and, in most cases, one or more grounded conductors such as a ground plane, line, or shield. Signal lines and grounded conductors are separated by one or more dielectric materials. Signals traveling in the transmission line will result in an electric field in the dielectric material. Any dielectric material other than a perfect vacuum will have associated with it a dielectric loss, which can limit the useful distance a high-frequency signal can travel through the transmission line.

SUMMARY

At least one aspect is directed to an apparatus including a first conductive plane, a core dielectric layer having a bottom surface in contact with the first conductive plane, a conductor having a bottom surface in contact with a top surface of the core dielectric layer, and a second conductive plane positioned over, and spaced apart from, a top surface of the conductor such that a gap separates the top surface of the conductor from a bottom surface of the second conductive plane. The top surface of the conductor is separated from the bottom surface of the second conductive plane by a first distance measured along an axis normal to the first conductive plane, and the bottom surface of the conductor is separated from the first conductive plane by a second distance greater than the first distance measured along the axis.

In some implementations, the apparatus can include a carrier frame positioned on the top surface of the core dielectric layer and supporting the second conductive plane over the core dielectric layer. A thickness of the carrier frame measured along the axis is greater than a thickness of the conductor measured along the axis, and the carrier frame is separated from the conductor in a direction parallel to the first conductive plane by a second gap. In some implementations, the second distance is at least twice as great as the first distance. In some implementations, the gap is substantially evacuated. In some implementations, the gap contains a gas.

In some implementations, the core dielectric layer is a first core dielectric layer, and the apparatus includes a second core dielectric layer having a bottom surface in contact with the top surface of the first core dielectric layer, and a top surface in contact with the bottom surface of the second conductive plane. The second core dielectric layer supports the second conductive plane over the core dielectric layer, and the second core dielectric layer defines cavity over and around the conductor. In some implementations, a region of the second core dielectric layer between the second conductive plane and the conductor has a thickness less than one quarter of the first distance. In some implementations, the second distance is at least twice as great as the first distance. In some implementations, the gap is substantially evacuated. In some implementations, the gap contains a gas.

At least one aspect is directed to a method of fabricating an apparatus. The method includes providing a first conductive plane, providing a core dielectric layer having a bottom surface in contact with the first conductive plane, providing a conductor having a bottom surface in contact with a top surface of the core dielectric layer, providing a second conductive plane positioned over, and spaced apart from, a top surface of the conductor such that a gap separates the top surface of the conductor from a bottom surface of the second conductive plane. The top surface of the conductor is separated from the bottom surface of the second conductive plane by a first distance measured along an axis normal to the first conductive plane, and the bottom surface of the conductor is separated from the first conductive plane by a second distance greater than the first distance measured along the axis.

In some implementations, the method can include providing a carrier frame positioned on the top surface of the core dielectric layer and supporting the second conductive plane over the core dielectric layer. A thickness of the carrier frame measured along the axis is greater than a thickness of the conductor measured along the axis, and the carrier frame is separated from the conductor in a direction parallel to the first conductive plane by a second gap. In some implementations, the second distance is at least twice as great as the first distance. In some implementations, the method can include substantially evacuating the gap. In some implementations, the method can include filling the gap with a gas.

In some implementations, the core dielectric layer is a first core dielectric layer, and the method can include providing a second core dielectric layer having a bottom surface in contact with the top surface of the first core dielectric layer, and a top surface in contact with the bottom surface of the second conductive plane. The second core dielectric layer supports the second conductive plane over the core dielectric layer, and the second core dielectric layer defines cavity over and around the conductor. In some implementations, a region of the second core dielectric layer between the second conductive plane and the conductor has a thickness less than one quarter of the first distance. In some implementations, the second distance is at least twice as great as the first distance. In some implementations, the method can include substantially evacuating the gap. In some implementations, the method can include filling the gap with a gas.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1:
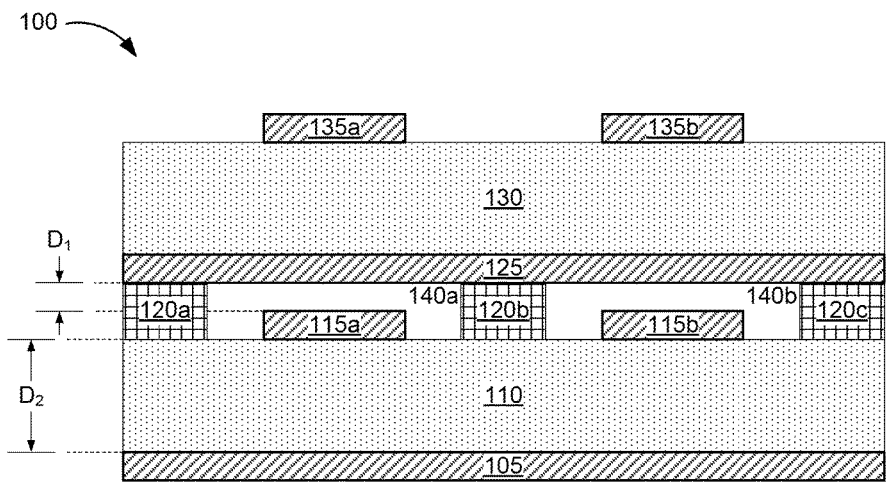
FIG. 1 illustrates a first example of embedded air gap transmission lines.

This disclosure generally relates to improving the performance of conductive signal traces carrying high-frequency signals in printed circuit boards (PCBs). For signals with sufficiently high frequency content, conductors such as conductive traces on a PCB can approximate transmission lines. Transmission lines are characterized by a characteristic impedance based on the distributed series inductance of the conductive trace, and a distributed parallel capacitance between the conductive trace and a nearby reference conductor or current return path such as one or more conductive ground plane layers in the PCB. The conductive trace can experience losses based on the series resistance of the conductive signal trace itself, as well as through dielectric loss caused by interaction between the electric field and the dielectric media between the conductor conductive trace and the ground plane. Dielectric losses result from conversion of some of the electrical energy of the signal traveling in the conductive trace into heat energy in the dielectric.

Dielectric loss can limit the "reach," or distance that high frequency signals can travel through the conductive traces before suffering too much loss of signal fidelity. In addition, the dielectric constant, or relative permittivity, of the dielectric material can reduce the velocity factor of the conductive trace, slowing the speed of propagation of the signal along the trace, and further limiting the signal's reach. In some cases, the dielectric loss and velocity factor can be addressed with re-timers, which can resync the data signal with the system clock and improve signal strength; however, this approach is costly and adds complexity to the system.

Accordingly, this disclosure proposes creating air-gap transmission lines in a PCB. Air (or other gas or vacuum) has a lower dielectric loss and relative permittivity of any known solid dielectric, including expensive exotic materials. The air gap can be created in several different ways. In one implementation, conductors, such as conductive traces, can be flanked by a carrier frame, which is separated from the conductors by an air gap in the horizontal direction. The carrier frame and conductors can be formed on a top side of a core dielectric layer, which can be a traditional PCB dielectric material such as FR-4. The bottom side of the core layer can be in contact with a first conductive plane. The conductors can have a bottom surface in contact—either partially, substantially, or completely—with a top surface of the core dielectric layer. A second conductive plane can be positioned above the carrier frame and the conductors. The carrier frame can support the second conductive plane over the conductors and maintain the air gap between the conductors and the second conductive plane. The second conductive plane can be adhered to a second core layer on a side of the second conductive plane opposite the carrier frame and conductors. The second core layer can support a second set of conductors and a second carrier frame to provide additional air-gap transmission lines in the PCB. The conductors will be separated from the first conductive plane by a first distance through the core layer, and from the second conductive plane by a second distance through the air gap. The second distance should be smaller than the first distance such that most of the electromagnetic energy between the conductors and the conductive planes concentrates in the air gap rather than the core layer so as to reduce dielectric losses in the core layer.

In another implementation, the conductors can be positioned on a first core layer over a first conductive plane. The conductors can have a bottom surface in contact—either partially, substantially, or completely—with a top surface of the core dielectric layer. A second core layer can be positioned over the conductors. The second core layer can define a groove that is molded, cut, or machined into it to create an air gap around the conductors. A second conductive plane can be adhered to the second core layer on a side of the second core layer opposite the conductors. Similar to the previously described implementation, the first and second core layers should be dimensioned to minimize dielectric losses in the core layers. In particular, the region of the second core layer between the conductors and the second conductive plane should be cut or molded to be as thin as possible within the limits of the fabrication process. Conversely, the first core layer should be thicker than the distance across the air gap. The thicker first core layer and the thinner region of the second core layer can increase the strength of the electric field in the air gap relative to the strength of the electric field in the core layers, and thus reduce dielectric losses in the core layers.

FIG. 1 illustrates a first example of embedded air gap transmission lines. The embedded air gap transmission lines are formed in a printed circuit board (PCB) 100. The PCB 100 includes a first conductive plane 105, a first core layer 110, conductive traces 115a and 115b (collectively "conductive traces 115"), a carrier frame comprising carrier frame portions 120a, 120b, and 120c (collectively "carrier frame 120"), a second conductive plane 125, a second core layer 130, and additional conductive traces 135a and 135b (collectively "conductive traces 135").

Although illustrated as a PCB, the embedded air gap transmission lines can be fabricated in other structures such as flexible printed circuits, electromechanical devices such as those created by additive manufacturing and 3D-printing processes, microelectromechanical systems (MEMS), and/or chip sockets for integrated circuits.

The first conductive plane 105 can be continuous or substantially continuous layer of a conductive metal such as copper, tin, aluminum, gold, silver, etc. The metal can be deposited onto the first core layer 110 such that a bottom surface of the first core layer 110 is in contact with the first conductive plane 105. The conductive plane 105 can represent a low-impedance current path set to a reference voltage such as a circuit or earth ground, or other DC voltage. The first core layer 110 can be a dielectric material such as FR-4 or polyimide, or other dielectric material used in PCBs or flexible printed circuits. The conductive traces 115 can be a conductive metal such as copper, tin, aluminum, gold, silver, etc., deposited on or otherwise adhered to a top surface of the first core layer 110. In some implementations, the conductive traces 115 can include 3 oz weight copper foil. In some implementations, the conductive traces 115 can include 1 or 2 oz weight copper. In some implementations, the conductive traces 115 can include 4 oz weight copper. In some implementations, the conductive traces 115 can include 5 oz weight copper. A width of the conductive traces 115 can be set to provide an adequate cross section for the desired current taking into account skin effects of high-frequency signals. In addition, the width of the conductive traces 115 can be set taking into account the proximity and size of the first conductive plane 105 and second conductive plane 125 with an eye towards the desired characteristic impedance of the transmission line. In some implementations, the width of the conductive traces 115 can be approximately 12 mils (0.012"). In some implementations, the width of the conductive traces 115 can be approximately 8-16 mils. In some implementations, the width of the conductive traces 115 can be approximately 4-20 mils.

The PCB 100 includes the second conductive plane 125. The second conductive plane 125 can include a conductive metal such as copper, tin, aluminum, gold, silver, etc. The second conductive plane 125 is positioned over, and spaced apart from, a top surface of the conductive traces 115 such that a gap 140a or 140b (collectively "gaps 140") separates the top surface of the conductive traces 115 from a bottom surface of the second conductive plane 125. The top surface of the conductive traces 115 is separated from the bottom surface of the second conductive plane 125 by a first distance $D_1$ measured along an axis normal to the first conductive plane 105, and the bottom surface of the conductive traces 115 is separated from the first conductive plane 105 by a second distance $D_2$ greater than the first distance measured along the axis. In some implementations, $D_1$ can be approximately 8 mil (0.008"). In some implementations, $D_1$ can be approximately 4-12 mils. In some implementations, $D_1$ can 12-20 mils.

The conductive traces 115 each form a transmission line structure with the first conductive plane 105, the second conductive plane 125, and the first core layer 110. When a high-frequency signal travels through one of the conductive traces 115, it will create an electric field between the conductive traces 115 and the first conductive plane 105 and the second conductive plane 125. The electric field will permeate both the gap 140 and the first core layer 110. Any dielectric material other than a perfect vacuum will cause some dielectric loss in any electric field permeating it. The gap 140, which can either be partially or substantially evacuated, or filled with air or other gas, can cause less dielectric loss than the first core layer 110 for a given strength of electric field. Thus, introduction of the gap 140 around the conductive traces 115 will reduce dielectric losses for high-frequency signal traveling through the conductive traces 115. The relative distances between the conductive traces 115 through the first core layer 110 to the first conductive plane 105 ($D_2$), and through the gap 140 to the second conductive plane 125 ($D_1$), respectively, can be adjusted to reduce dielectric loss further. In particular, the electric field across a dielectric is inversely proportional to the square of the distance between the conductors on either side of the dielectric; that is, the shorter the distance, the higher the electric field. Accordingly, by reducing $D_1$ relative to $D_2$, the electric field can be concentrated in the gap 140 and reduced in the first core layer 110. This configuration can reduce the dielectric loss considerably. In some implementations, $D_2$ can be set to at least twice as far as $D_1$.

The PCB 100 can include additional conductive traces 135. The additional conductive traces 135 can be configured to convey direct current (DC) or relatively low-frequency signals such that the additional conductive traces 135 do not exhibit transmission-line characteristics. In some implementations, however, the additional conductive traces 135 may convey high-frequency signals and exhibit transmission-line characteristics. In some implementations, the PCB 100 can include additional layers configured to create additional air gaps around the additional conductive traces 135, thereby reducing dielectric losses of signals traveling through the additional conductive traces 135 in a manner similar to that of the conductive traces 115.

Figure 2:
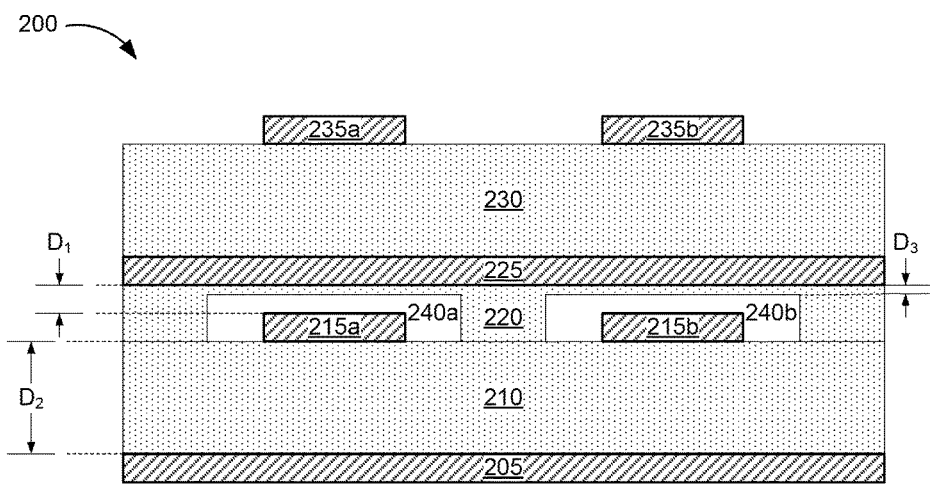
FIG. 2 illustrates a second example of embedded air gap transmission lines.

In some implementations, the PCB 100 can include a carrier frame 120 for maintaining the desired separation between the conductive traces 115 and the second conductive plane 125. The carrier frame 120 can be a polymer, ceramic, or composite material configured to provide mechanical support to the other components of the PCB 100. In some implementations, the carrier frame 120 can be positioned on the top surface of the first core layer 110. The carrier frame 120 can support the second conductive plane 125 over the first core layer 110 in a manner that can maintain the gap 140 between the conductive traces 115 and the second conductive plane 125. Accordingly, a thickness of the carrier frame 120 as measured along an axis normal to the first conductive plane 105 is greater than a thickness of the conductive traces 115 measured along the same axis. In some implementations, the thickness of the carrier frame 120 can be approximately 10 mils (0.010"). In some implementations, the thickness of the carrier frame 120 can be approximately 8-12 mils. In some implementations, the thickness of the carrier frame 120 can be approximately 5-15 mils. The carrier frame 120 can be separated from the conductive traces 115 by an additional gap 140 in a direction parallel to the first conductive plane 105. In some implementations, however, a gap around conductive traces can be created/maintained using different structures. FIG. 2, described below, illustrates another possible structure for maintaining a gap.

FIGS. 3A-3D and 4A-4B and the associated description below describe steps of two example processes for fabricating structures similar to the PCB 100.

FIG. 2 illustrates a second example of embedded air gap transmission lines. The embedded air gap transmission lines are formed in a printed circuit board (PCB) 200. The PCB 200 includes a first conductive plane 205, a first core layer 210, conductive traces 215a and 215b (collectively "conductive traces 215"), a second core layer 220, a second conductive plane 225, a third core layer 230, and conductive traces 235a and 235b (collectively "conductive traces 235"). Similar to the PCB 100 described above, the PCB 200 is provided for illustrative purposes; however, one of skill in the art can appreciate that the same or similar structures could be manufactured and used in flexible printed circuits, elecromechanical devices such as those created by additive manufacturing and 3D-printing processes, microelectromechanical systems (MEMS), and/or chip sockets for integrated circuits.

The first conductive plane 205, the first core layer 210, the conductive traces 215, and the second conductive plane 225 can be similar to the first conductive plane 105, the first core layer 110, the conductive traces 115, and the second conductive plane 125, respectively, of the PCB 100. In addition, the third core layer 230 and the additional conductive traces 235 can be similar to the second core layer 130 and the additional conductive traces 135, respectively, of the PCB 100. However, instead of employing a carrier frame to maintain a gap around the conductive traces 215, the PCB 200 includes a second core layer 220. In some implementations, the second core layer 220 can be a dielectric material similar to the dielectric material used in the first core layer 210 or the third core layer 230. In some implementations, the second core layer 220 may be a different type of dielectric material chosen for lower dielectric loss, or better mechanical properties that make it easier to fabricate into the desired structural configuration.

The second core layer 220 can have a bottom surface in contact with the top surface of the first core layer 210. A top surface of the second core layer 220 can be in contact with the bottom surface of the second conductive plane 225. The second core layer 220 can support the second conductive plane 225 over the first core layer 210. The second core layer 220 can define cavities that create gaps 240a and 240b (collectively "gaps 240") over and around the conductive traces 215. In some implementations, the cavity can be manufactured by cutting or machining the core layer 220 using a mill, blade, or laser. In some implementations, the cavity can be manufactured by molding or through chemical processes such as etching. In some implementations, the gaps 240 can be partially or substantially evacuated. In some implementations, the gaps 240 can be filled with air or other gas. In some implementations, the thickness of the thick portion of the second core layer 220 can be approximately 10 mils (0.010"). In some implementations, the thickness of the thick portion of the second core layer 220 can be approximately 8-12 mils. In some implementations, the thickness of the thick portion of the second core layer 220 can be approximately 5-15 mils.

Similar to the PCB 100, in the PCB 200 a top surface of the conductive traces 215 is separated from a bottom surface of the second conductive plane 225 by a first distance $D_1$ measured along an axis normal to the first conductive plane 205, and a bottom surface of the conductive traces 215 is separated from the first conductive plane 205 by a second distance $D_2$ greater than the first distance measured along the axis. In some implementations, $D_1$ can be approximately 8 mil (0.008"). In some implementations, $D_1$ can be approximately 4-12 mils. In some implementations, $D_1$ can 12-20 mils. In some implementations, $D_2$ can be set to at least twice as far as $D_1$ to reduce the dielectric loss that occurs in the first dielectric layer 210. Unlike the PCB 100, however, the region between the conductive traces 215 and the second conductive plane 225 of the PCB 200 may include a thin portion of dielectric material of the second core layer 220. The thin portion of dielectric material may serve to maintain the shape of the second core layer 220, or may be a necessary remnant of the fabrication process. The thin portion of dielectric material will still exhibit dielectric loss, which may be magnified somewhat based on the concentration of the electric field in the gap 240 relative to the electric field in the first core layer 210. By reducing the thickness of the thin portion of the core layer 220, however, this dielectric loss can be minimized. For example, in some implementations, the thin portion of the core layer 220 between the conductive traces 215 and the second conductive plane 225 can have a thickness $D_3$ that is less than one quarter of $D_1$. In some implementations, $D_3$ can be approximately 2 mil (0.002"). In some implementations, $D_3$ can be approximately 0.5-4 mils. In some implementations, the thin portion of the core layer 220 between the conductive traces 215 and the second conductive plane 225 can have a thickness $D_3$ that is equal or substantially equal to a minimum thickness allowed by the fabrication process used to create the second core layer 220.

FIGS. 5A-5D and the associated description below describe steps of an example process for fabricating structures similar to the PCB 200.

FIGS. 3A-3D illustrate steps of a first example process for fabricating the embedded air gap transmission line of FIG. 1. The process can start with the first core layer 110. The first conductive plane 105 and the conductive traces 115 can then be deposited or otherwise adhered onto the first core layer 110. In some implementations, the conductive traces 115 can be plated onto the first core layer 110 as a copper plane, and then subjected to an etching process to remove unwanted copper, resulting in the configuration shown in FIG. 3A.

Figure 3A:
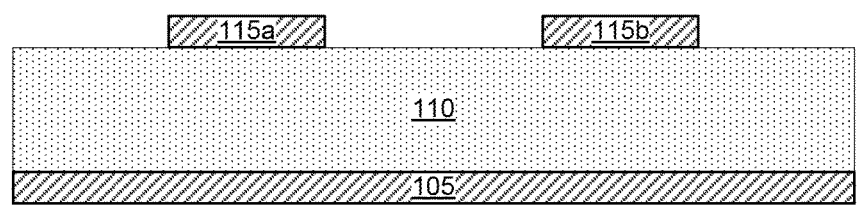
FIGS. 3A-3D illustrate steps of a first example process for fabricating the embedded air gap transmission lines of FIG. 1.
Figure 3B:
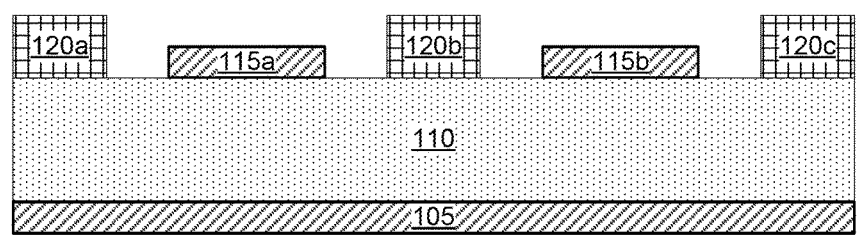

In FIG. 3B, the carrier frame 120 has been positioned over and adhered to the first core layer 110. Although the cross section shows three separate portions of the carrier frame 120, in some implementations the carrier frame 120 may be formed from a contiguous molded or machined piece of material. In some implementations, the carrier frame 120 may be formed from multiple pieces of molded or machined material individually adhered to the first core layer 110.

Figure 3C:
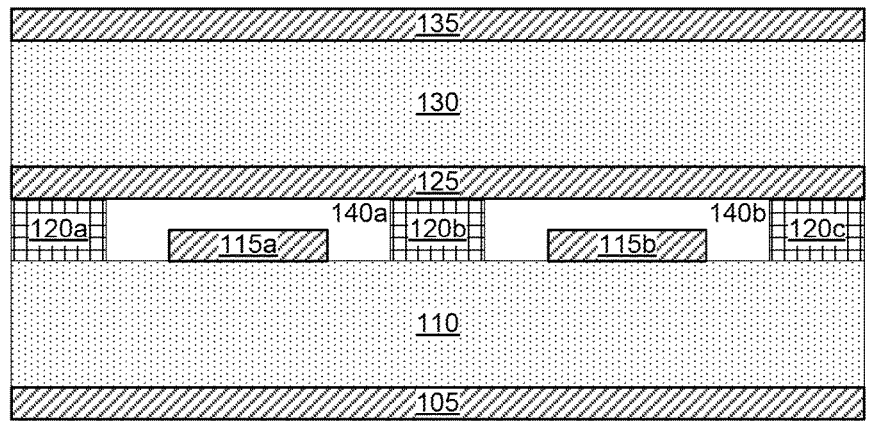
Figure 3D:
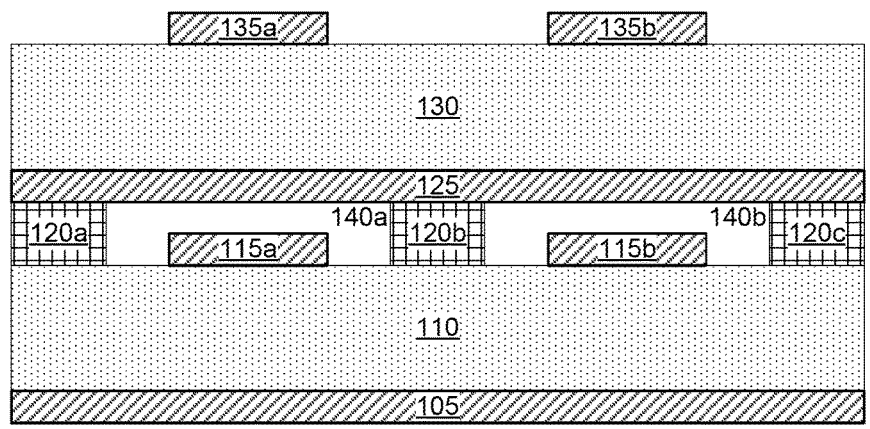

In FIG. 3C, the second conductive plane 125, the second core layer 130, and an additional conductive layer 135 have been positioned over and adhered to the carrier frame 120.

Following the bonding of the new layers to the carrier frame 120, the additional conductive layer 135 can be etched or otherwise stenciled to create the additional conductive traces 135a and 135b.

Figure 4A:
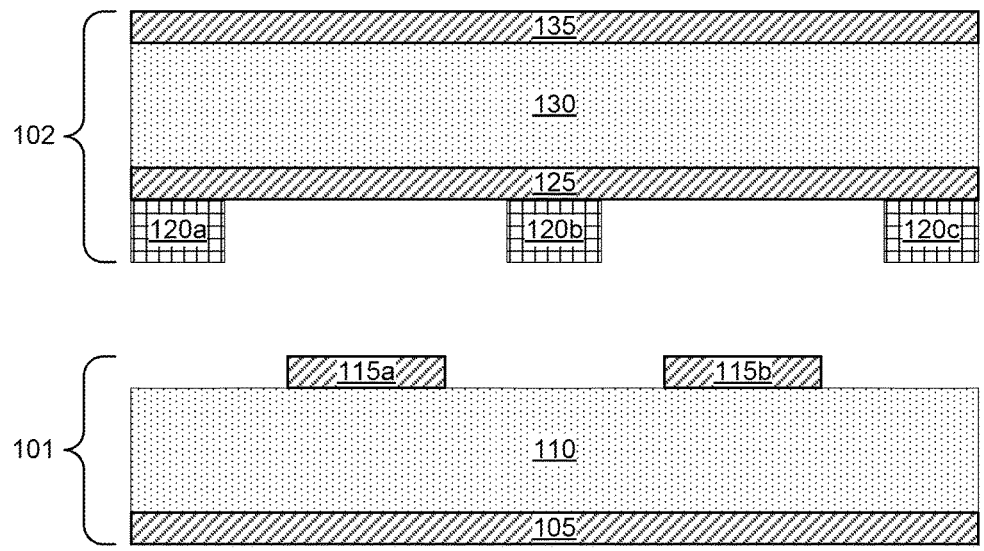
FIGS. 4A-4B illustrate steps of a second example process for fabricating the embedded air gap transmission lines of FIG. 1.
Figure 4B:
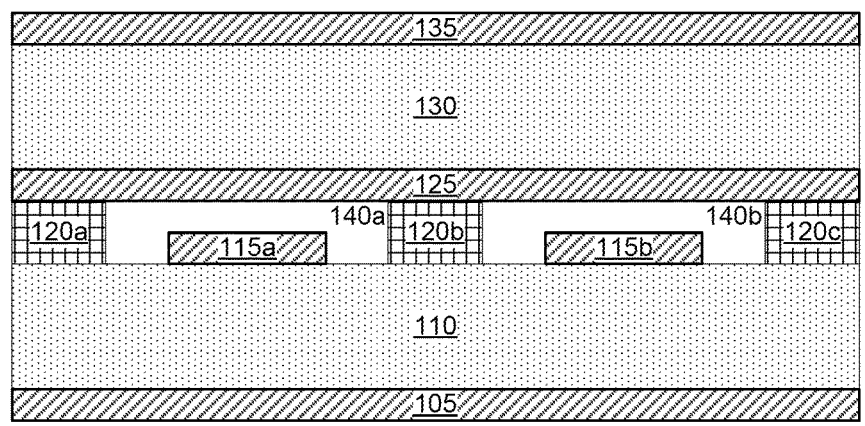

FIGS. 4A-4B illustrate steps of a second example process for fabricating the embedded air gap transmission line of FIG. 1. In this example, the portions of the PCB 100 are fabricated as two separate assemblies 101 and 102 and then combined. The first assembly 101 includes the first conductive plane 105, the first conductor layer 110, and the conductive traces 115 already formed. The second assembly 102 includes the carrier frame 120, the second conductive plane 125, the second core layer 130, and the additional conductive layer 135. The two assemblies 101 and 102 can be brought together and bonded to form the PCB 100 as shown in FIG. 4B.

FIGS. 5A-5D illustrate steps of an example process for fabricating the embedded air gap transmission line of FIG. 2. The process can start with the first core layer 210. The first conductive plane 205 and the conductive traces 215 can then be deposited, plated, or otherwise adhered onto the first core layer 210 to form a first assembly 210. In some implementations, the conductive traces 215 can be plated onto the first core layer 210 as a copper plane and then subjected to an etching process to remove unwanted copper, resulting in the configuration shown in FIG. 5A.

Figure 5A:
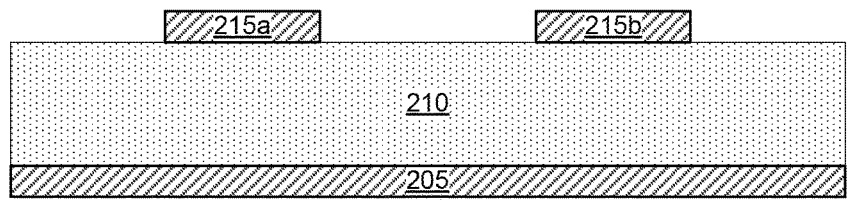
FIGS. 5A-5D illustrate steps of an example process for fabricating the embedded air gap transmission lines of FIG. 2.
Figure 5B:
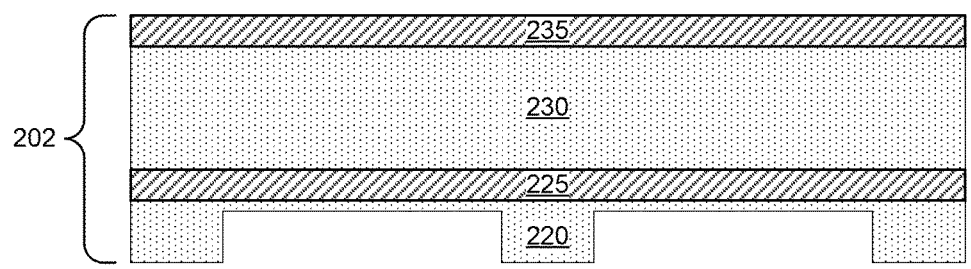
Figure 5B:
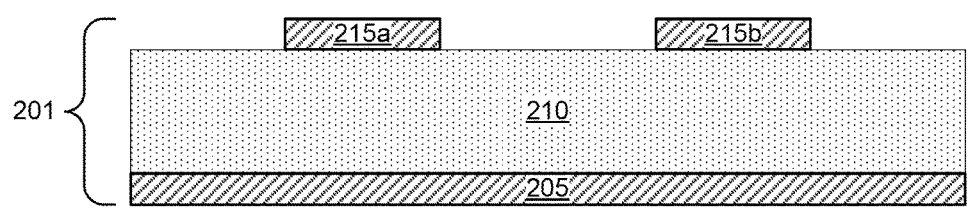

A similar process can be used to join the layers of the second assembly 202; namely the third core layer 230, the second conductive plane 225, the additional conductive layer 235, and the second core layer 220. As shown in FIG. 5B, the second core layer 220 can be machined or molded to define cavities, prior to the second assembly 202 being bonded to the first assembly 201.

Figure 5C:
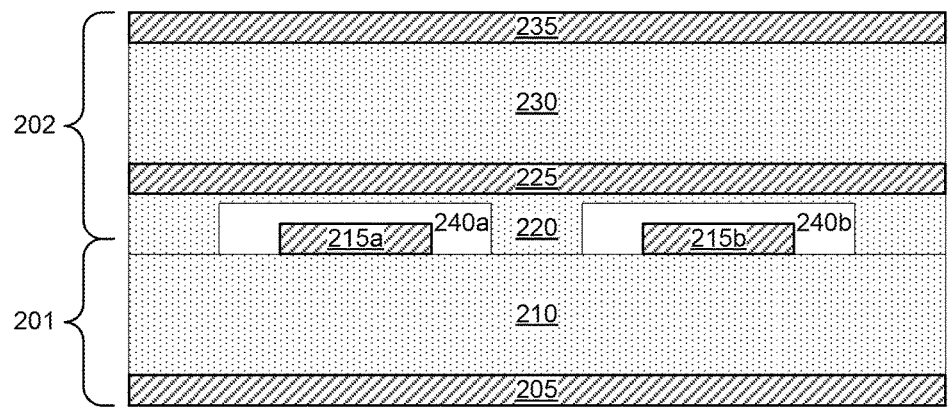
Figure 5D:
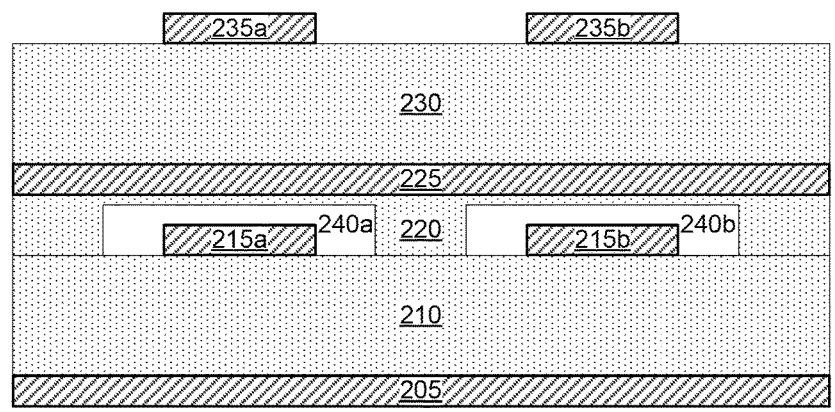

In FIG. 5C, the first and second assemblies 201 and 202 are bonded together, and the gaps 240 around the conductive traces 215 are created. The additional conductive layer 230 can then be etched or otherwise stenciled to create the additional conductive traces 235a and 235b shown in FIG. 5D.

Figure 6A:
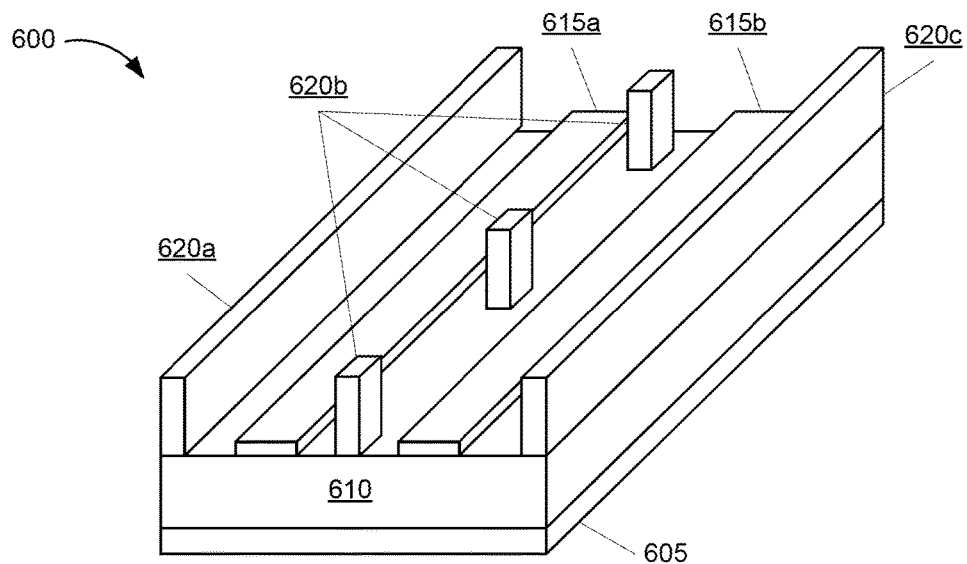
FIGS. 6A-6B illustrate two examples of loosely coupled differential pair embedded air gap transmission lines.
Figure 6B:
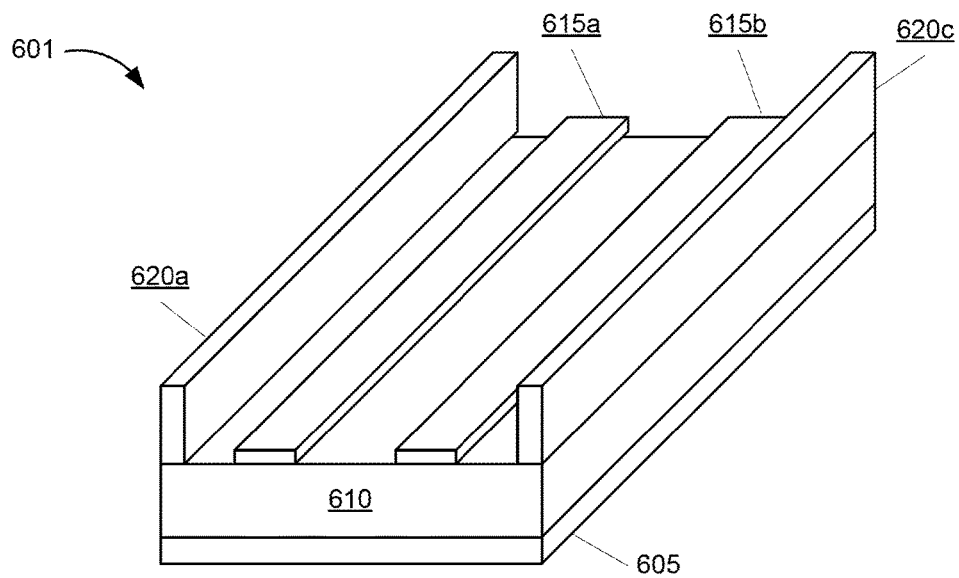

FIGS. 6A-6B illustrate two examples of loosely coupled differential pair embedded air gap transmission lines. In some implementations, the loosely coupled differential pair embedded air gap transmission lines can be formed in a printed circuit board (PCB) 600 as shown in FIG. 6A. The PCB 600 includes a first conductive plane 605, a first core layer 610, conductive traces 615a and 615b (collectively "conductive traces 615") that form a loosely coupled differential pair, and a carrier frame comprising carrier frame portions 620a, 620b, and 620c (collectively "carrier frame 620"). Although illustrated as a PCB, the embedded air gap transmission lines can be fabricated in other structures such as flexible printed circuits, electromechanical devices such as those created by additive manufacturing and 3D-printing processes, microelectromechanical systems (MEMS), and/or chip sockets for integrated circuits.

The carrier frame 620 of the PCB 600 includes carrier frame portions 620b periodically placed along the PCB 600. The carrier frame portions 620b can provide mechanical integrity to maintain the distance between the conductive traces 615 and a second conductive plane (not pictured). In some implementations, the carrier frame portions can be periodically placed at a fraction of an electrical length of a signal edge of a differential pair signal traveling along the conductive traces 615. Such a structure can help to minimize the impact of the impedance discontinuity that the carrier frame portions 620b introduce to the transmission line structure.

In some implementations, the loosely coupled differential pair embedded air gap transmission lines can be formed in a printed circuit board (PCB) 601 as shown in FIG. 6B. The PCB 601 includes a first conductive plane 605, a first core layer 610, conductive traces 615a and 615b (collectively "conductive traces 615") that form a loosely coupled differential pair, a carrier frame comprising carrier frame portions 620a and 620c (collectively "carrier frame 620"). The PCB 601 does not include carrier frame portions 620b between the conductive traces 615 present in the PCB 601. The loosely coupled differential pair embedded air gab transmission lines of the PCB 601 may therefore exhibit improved continuity of impedance along the conductive traces 615a and 615b.

Figure 7:
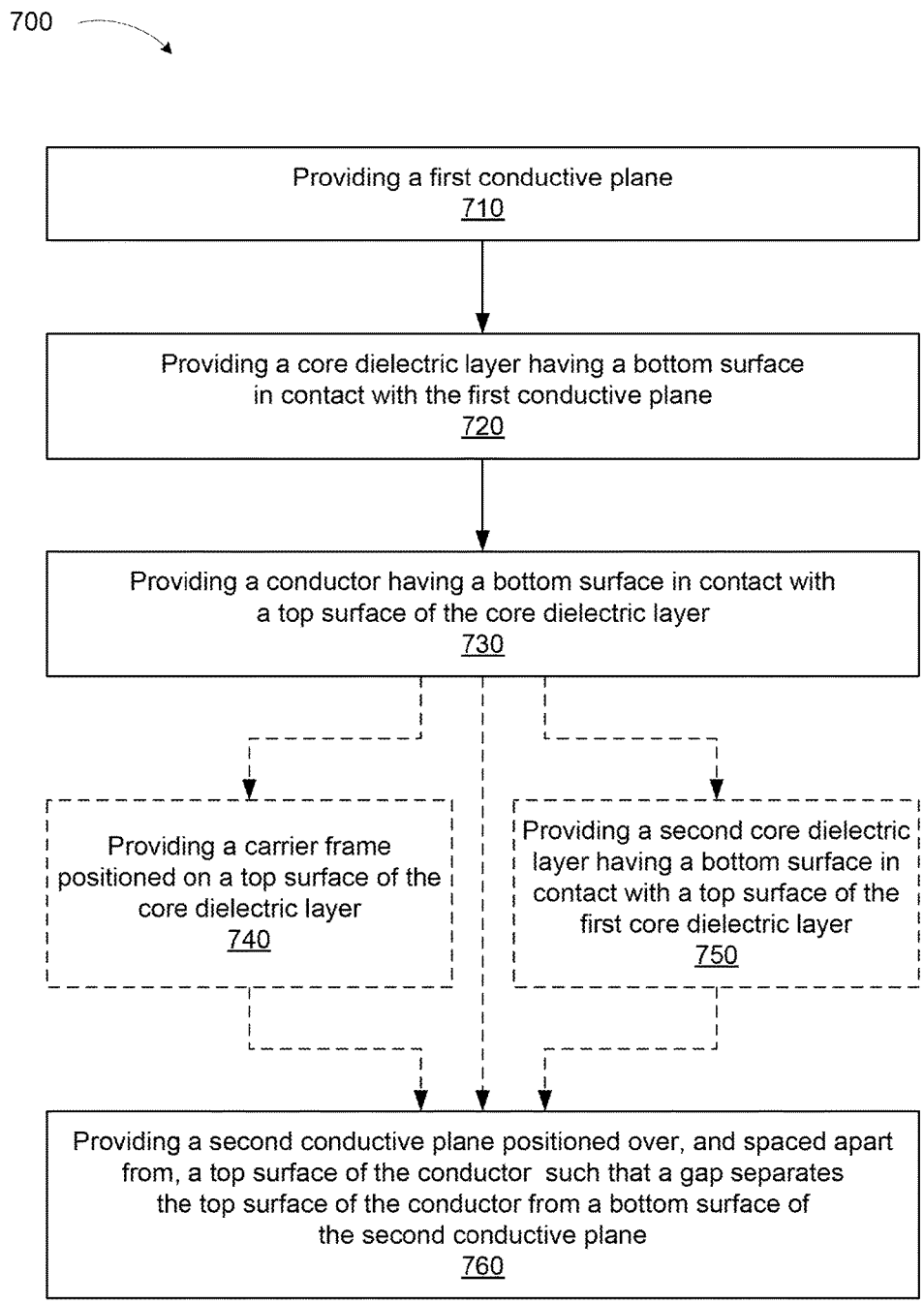
FIG. 7 is a flowchart of an example method of fabricating an embedded air gap transmission line according to an example implementation.

FIG. 7 is a flowchart of an example method 700 of fabricating an embedded air gap transmission line according to an example implementation. The method 700 includes providing a first conductive plane (stage 710). The method 700 includes providing a core dielectric layer having a bottom surface in contact with the first conductive plane (stage 720). The method 700 includes providing a conductive trace having a bottom surface in contact with a top surface of the core dielectric layer (stage 730). In some implementations, the method 700 continues directly to stage 760. In some implementations, the method 700 includes providing a carrier frame positioned on a top surface of the core dielectric layer (stage 740) before proceeding to stage 760. In some implementations, the method 700 includes providing a second core dielectric layer having a bottom surface in contact with a top surface of the first core dielectric layer (stage 750) before proceeding to stage 760. The method 700 includes providing a second conductive plane positioned over, and spaced apart from, a top surface of the conductive trace such that a gap separates the top surface of the conductive trace from a bottom surface of the second conductive plane (stage 760).

The method 700 includes providing a first conductive plane (stage 710). The first conductive plane can be, for example, the first conductive plane 105 or 205 previously described.

The method 700 includes providing a core dielectric layer having a bottom surface in contact with the first conductive plane (stage 720). The core dielectric layer can be, for example, the first core layer 110 or 210 previously described. The first conductive plane can be deposited, plated, or otherwise adhered to the core dielectric layer.

The method 700 includes providing a conductive trace having a bottom surface in contact with a top surface of the core dielectric layer (stage 730). The conductive trace can be, for example, the conductive trace 115 or 215 previously described. The conductive trace can be formed by depositing, plating, or otherwise adhering a conductive layer to the core dielectric layer, and then removing undesired portions of the conductive material to form the traces.

In some implementations, the method 700 continues directly to stage 760. In some implementations, the method 700 can include one of the stages 740 or 750 described below.

In some implementations, the method 700 includes providing a carrier frame positioned on a top surface of the core dielectric layer (stage 740) before proceeding to stage 760. The carrier frame can be, for example, the carrier frame 120 previously described. An assembly including a carrier frame can resemble the PCB 100 described above with respect to FIG. 1. A thickness of the carrier frame can be thicker than the conductive traces, thereby maintaining a separation between the conductive traces and a second conductive plane, and defining an evacuated or gas-filled gap around the conductive traces. Following the provision of the carrier frame, the method 700 can proceed to stage 760.

In some implementations, the method 700 includes providing a second core dielectric layer having a bottom surface in contact with a top surface of the first core dielectric layer (stage 750) before proceeding to stage 760. The second core dielectric layer can be, for example, the second core layer 220 previously described. An assembly including the second core dielectric layer can resemble the PCB 200 described above with respect to FIG. 2. The second core dielectric layer can define a cavity that can partially surround the conductive traces and create a gap between the conductive traces and a second conductive plane. The second core dielectric layer can therefore have a thin portion (where the cavity is defined) and a thick portion (around the cavity). A thickness of the thick portion of the second core dielectric layer can be thicker than the conductive traces, thereby maintaining a separation between the conductive traces and a second conductive plane, and defining an evacuated or gas-filled gap around the conductive traces. A thickness of the thin portion of the second core dielectric layer can be kept thin—in some implementations, as thin as the particular fabrication process will allow—to reduce dielectric losses through this portion of the second core dielectric layer. Following the provision of the carrier frame, the method 700 can proceed to stage 760.

The method 700 includes providing a second conductive plane positioned over, and spaced apart from, a top surface of the conductive trace such that a gap separates the top surface of the conductive trace from a bottom surface of the second conductive plane (stage 760). The second conductive plane is separated from the first core dielectric layer by the carrier frame or the second core dielectric layer. With the second conductive plane in place, the gap is defined between the conductive trace and the second conductive plane. In some implementations, the method 700 can include filling this gap with air or another gas. In some implementations, the method 700 can include partially or substantially evacuating the gap.

A person of skill in the art will understand that the stages of the method 700 can be performed in different orders without departing from the scope of the invention. In addition, the method 700 can include more or fewer steps without departing from the scope of the invention.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. An apparatus comprising:
   a first conductive plane;
   a core dielectric layer having a bottom surface in contact with the first conductive plane;
   a conductor having a bottom surface in contact with a top surface of the core dielectric layer; and
   a second conductive plane positioned over, and spaced apart from, a top surface of the conductor such that a gap separates the top surface of the conductor from a bottom surface of the second conductive plane, wherein:
      the top surface of the conductor is separated from the bottom surface of the second conductive plane by a first distance measured along an axis normal to the first conductive plane, and
      the bottom surface of the conductor is separated from the first conductive plane by a second distance that is at least twice as great as the first distance measured along the axis.

2. The apparatus of claim 1, comprising:
   a carrier frame positioned on the top surface of the core dielectric layer and supporting the second conductive plane over the core dielectric layer, wherein:
      a thickness of the carrier frame measured along the axis is greater than a thickness of the conductor measured along the axis, and
      the carrier frame is separated from the conductor in a direction parallel to the first conductive plane by a second gap.

3. The apparatus of claim 2, wherein the gap is substantially evacuated.

4. The apparatus of claim 2, wherein the gap contains a gas.

5. The apparatus of claim 1, wherein the core dielectric layer is a first core dielectric layer, the apparatus comprising:
   a second core dielectric layer having a bottom surface in contact with the top surface of the first core dielectric layer, and a top surface in contact with the bottom surface of the second conductive plane, wherein the second core dielectric layer supports the second conductive plane over the core dielectric layer, and the second core dielectric layer defines a cavity over and around the conductor.

6. The apparatus of claim 5, wherein:
   a region of the second core dielectric layer between the second conductive plane and the conductor has a thickness less than one quarter of the first distance.

7. The apparatus of claim 5, wherein the gap is substantially evacuated.

8. The apparatus of claim 5, wherein the gap contains a gas.

9. A method of fabricating an apparatus comprising: providing a first conductive plane; providing a core dielectric layer having a bottom surface in contact with the first conductive plane; providing a conductor having a bottom surface in contact with a top surface of the core dielectric layer; and providing a second conductive plane positioned over, and spaced apart from, a top surface of the conductor such that a gap separates the top surface of the conductor from a bottom surface of the second conductive plane, wherein: the top surface of the conductor is separated from the bottom surface of the second conductive plane by a first distance measured along an axis normal to the first conductive plane, and the bottom surface of the conductor is separated from the first conductive plane by a second distance that is at least twice as great as the first distance measured along the axis.

10. The method of claim 9, comprising:
    providing a carrier frame positioned on the top surface of the core dielectric layer and supporting the second conductive plane over the core dielectric layer, wherein:
       a thickness of the carrier frame measured along the axis is greater than a thickness of the conductor measured along the axis, and
       the carrier frame is separated from the conductor in a direction parallel to the first conductive plane by a second gap.

11. The method of claim 10, comprising:
    substantially evacuating the gap.

12. The method of claim 10, comprising:
    filling the gap with a gas.

13. The method of claim 9, wherein the core dielectric layer is a first core dielectric layer, the method comprising: providing a second core dielectric layer having a bottom surface in contact with the top surface of the first core dielectric layer, and a top surface in contact with the bottom surface of the second conductive plane, wherein the second core dielectric layer supports the second conductive plane over the core dielectric layer, and the second core dielectric layer defines a cavity over and around the conductor.

14. The method of claim 13, wherein:
    a region of the second core dielectric layer between the second conductive plane and the conductor has a thickness less than one quarter of the first distance.

15. The method of claim 13, comprising:
    substantially evacuating the gap.

16. The method of claim 13, comprising:
    filling the gap with a gas.

17. The apparatus of claim 1, wherein substantially the entire bottom surface of the core dielectric layer is in contact with the first conductive plane.

18. The method of claim 9, wherein substantially the entire bottom surface of the core dielectric layer is in contact with the first conductive plane.

* * * * *